(12) United States Patent
Kogure et al.

(10) Patent No.: US 9,347,620 B2
(45) Date of Patent: May 24, 2016

(54) SEMICONDUCTOR DEVICE, AND METHOD OF MANUFACTURING SEMICONDUCTOR DEVICE

(71) Applicant: Kabushiki Kaisha Toshiba, Minato-ku (JP)

(72) Inventors: Hideyuki Kogure, Fukaya (JP); Yuuta Yamada, Yokohama (JP); Takeshi Ikuta, Yokohama (JP); Toshiyuki Hayakawa, Yokohama (JP); Junichi Asada, Sagamihara (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 330 days.

(21) Appl. No.: 14/151,192

(22) Filed: Jan. 9, 2014

(65) Prior Publication Data

US 2015/0043228 A1 Feb. 12, 2015

Related U.S. Application Data

(60) Provisional application No. 61/863,650, filed on Aug. 8, 2013.

(51) Int. Cl.
| | |
|---|---|
| *F21K 99/00* | (2010.01) |
| *H05K 1/18* | (2006.01) |
| *H01L 21/78* | (2006.01) |
| *H01L 23/00* | (2006.01) |
| *H01L 25/16* | (2006.01) |
| *F21Y 101/02* | (2006.01) |
| *H01L 23/31* | (2006.01) |
| *H01L 21/56* | (2006.01) |

(52) U.S. Cl.
CPC . *F21K 9/30* (2013.01); *H01L 21/78* (2013.01); *H01L 24/97* (2013.01); *H01L 25/167* (2013.01); *H05K 1/186* (2013.01); *F21Y 2101/02* (2013.01); *H01L 21/561* (2013.01); *H01L 23/3121* (2013.01); *H01L 23/3135* (2013.01); *H01L 24/73* (2013.01); *H01L 2224/32225* (2013.01); *H01L 2224/48091* (2013.01); *H01L 2224/48227* (2013.01); *H01L 2224/73265* (2013.01); *H01L 2224/97* (2013.01); *H01L 2924/15151* (2013.01); *H01L 2924/15313* (2013.01); *H01L 2924/181* (2013.01); *H01L 2924/1815* (2013.01); *H01L 2924/19041* (2013.01); *H01L 2924/19042* (2013.01); *H01L 2924/19043* (2013.01); *H01L 2924/19105* (2013.01); *H05K 2201/10106* (2013.01); *H05K 2201/10159* (2013.01)

(58) Field of Classification Search
CPC ......... F21K 9/30; H01L 24/94; H01L 25/167; H01L 21/78
See application file for complete search history.

(56) References Cited

U.S. PATENT DOCUMENTS

| | | |
|---|---|---|
| 6,763,410 B2 | 7/2004 | Yu |
| 7,035,110 B1 | 4/2006 | Wang et al. |

(Continued)

*Primary Examiner* — David V Bruce
(74) *Attorney, Agent, or Firm* — Oblon, McClelland, Maier & Neustadt, L.L.P.

(57) ABSTRACT

According to one embodiment, a semiconductor device includes a board, a controller chip, a semiconductor chip, a sealing portion, and a component. The board includes a first surface and a second surface opposite to the first surface, the first surface comprising a terminal. The controller chip is on the second surface of the board. The semiconductor chip is on the second surface of the board. The sealing portion integrally covers the controller chip and the semiconductor chip and does not cover a region of the second surface of the board. The component is on the region of the second surface of the board to perform an operation with respect to the outside of the semiconductor device.

13 Claims, 10 Drawing Sheets

(56) References Cited

U.S. PATENT DOCUMENTS

| | | | |
|---|---|---|---|
| 7,518,879 B2 | 4/2009 | Chung et al. | |
| 8,194,408 B2 | 6/2012 | Chou et al. | |
| 2003/0161199 A1* | 8/2003 | Estakhri | G11C 29/44 365/200 |

* cited by examiner

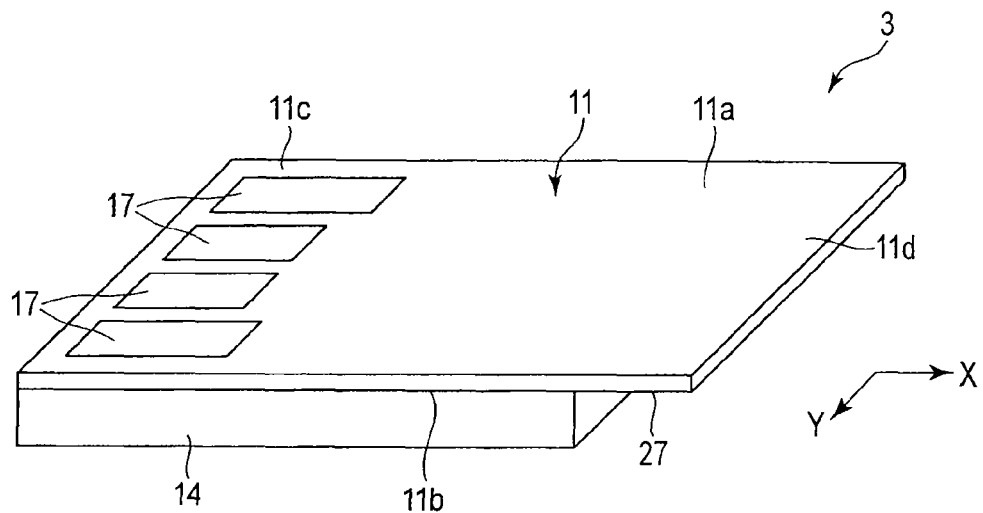
F I G. 3
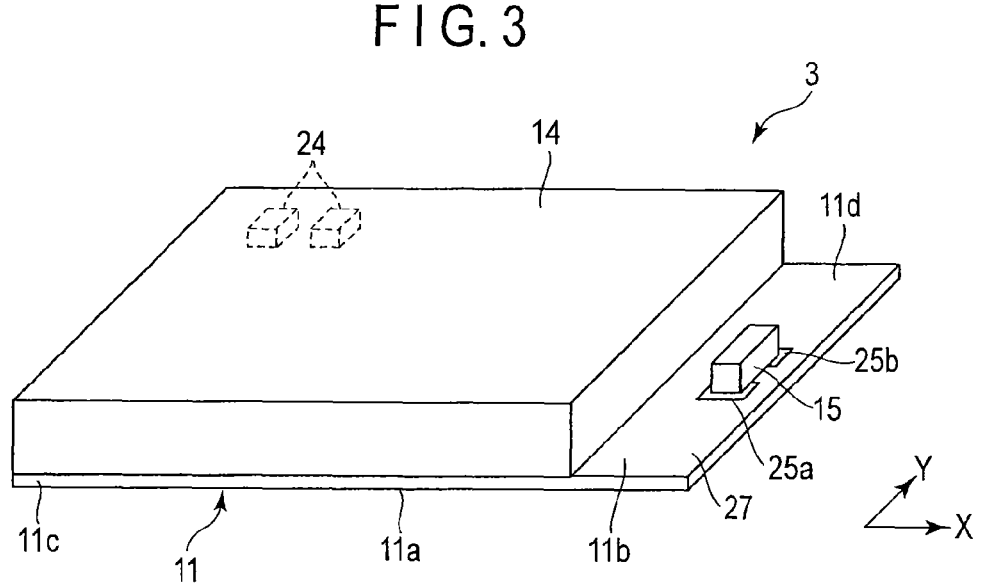
F I G. 4
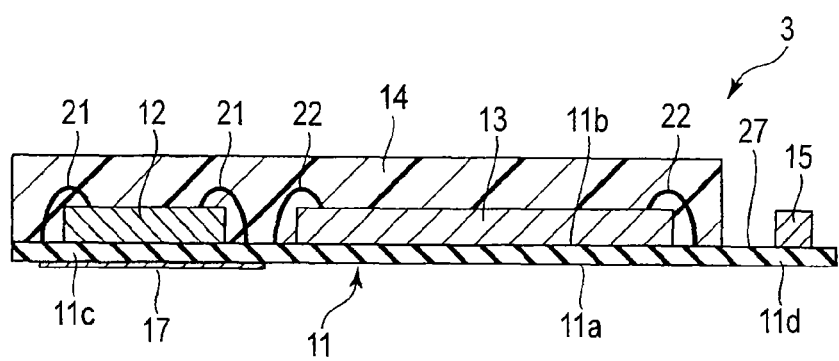
F I G. 5

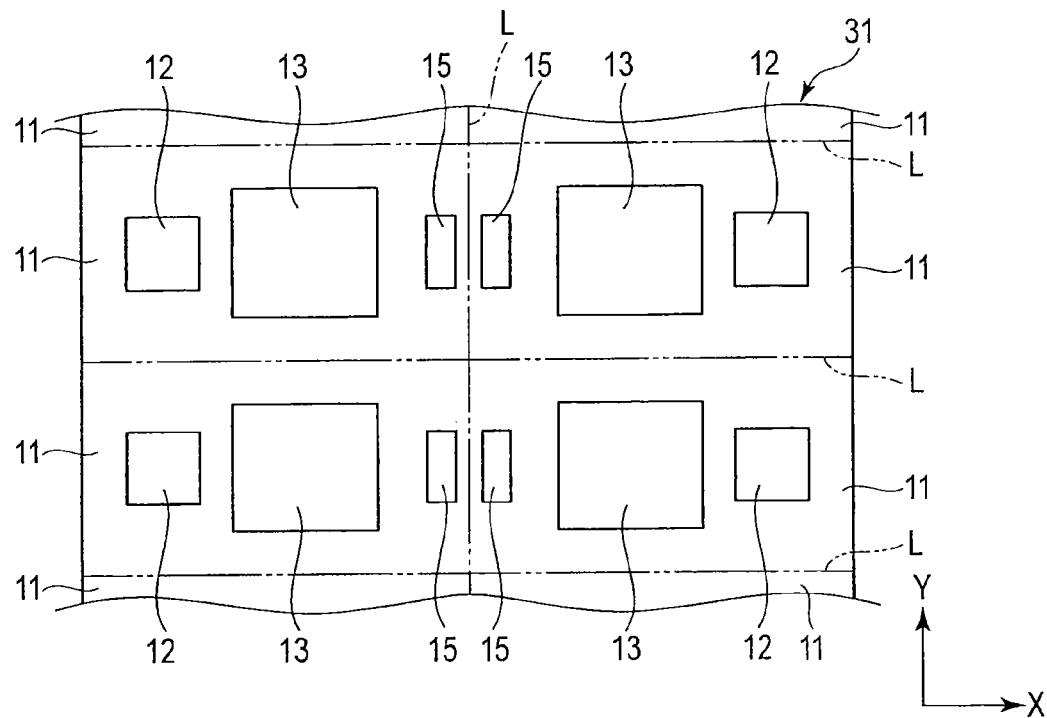
F I G. 7
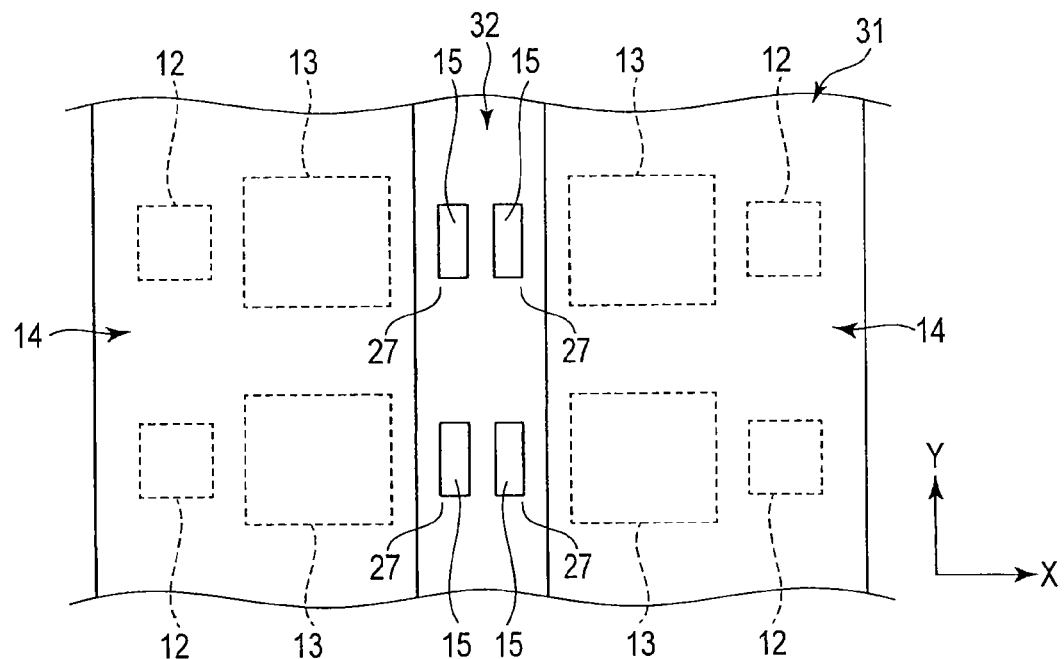
F I G. 8

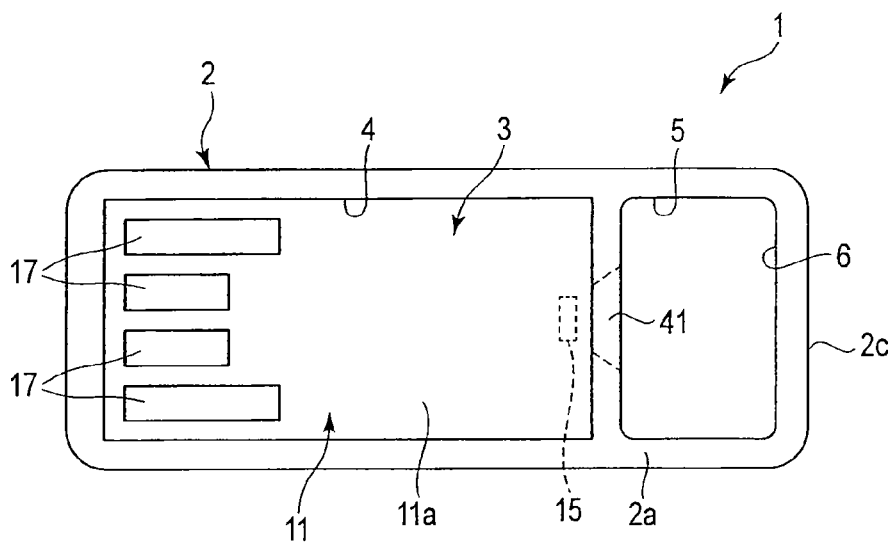
F I G. 9
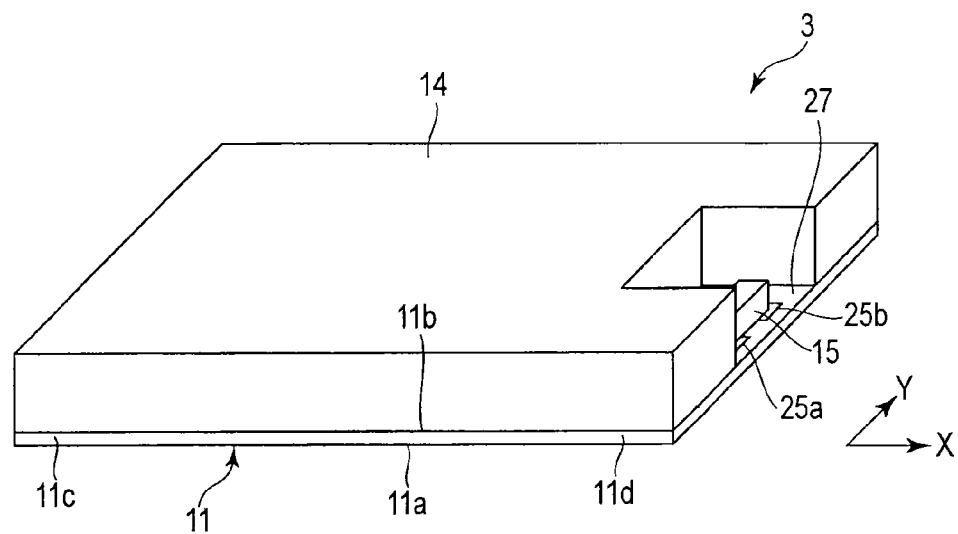
F I G. 10
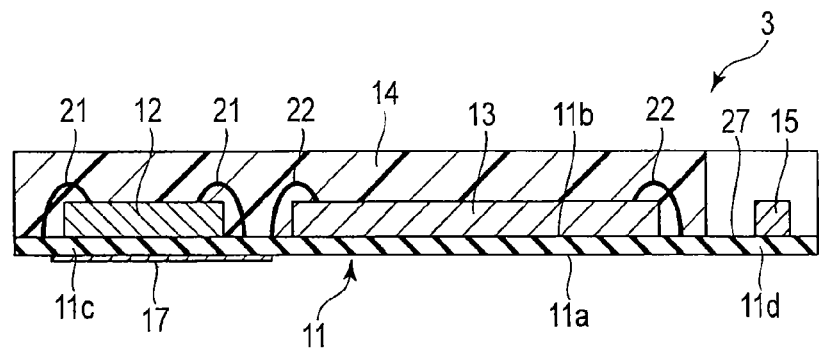
F I G. 11

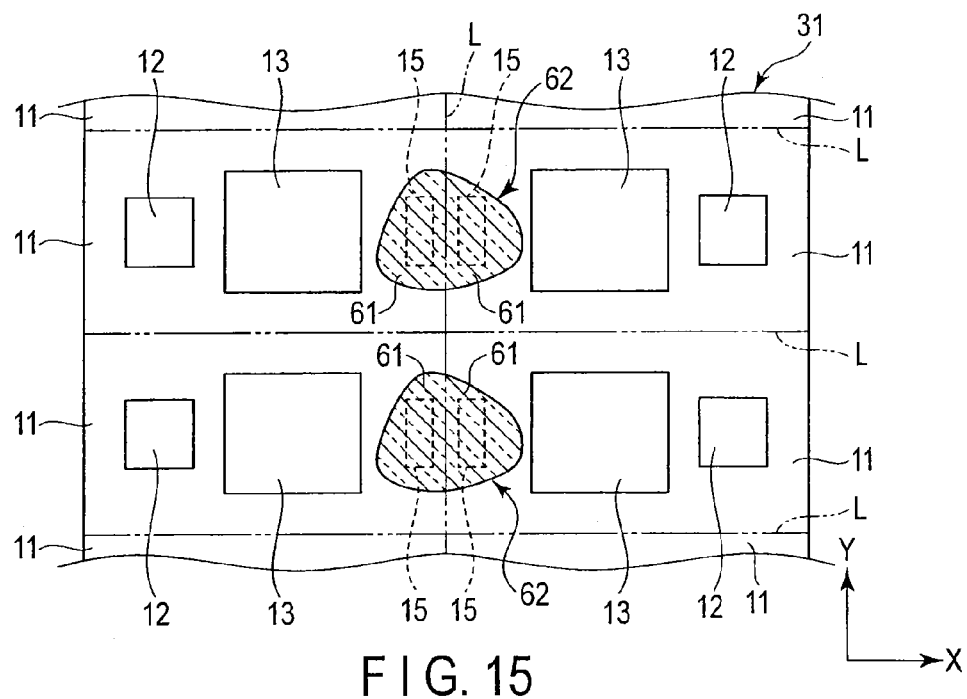
F I G. 15
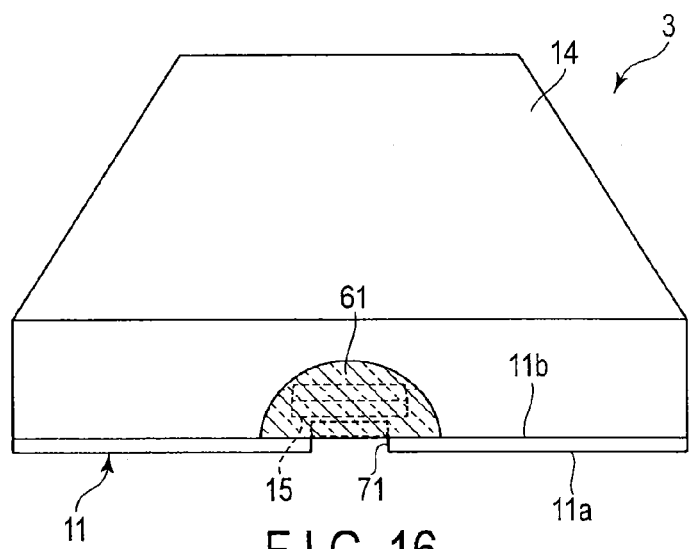
F I G. 16
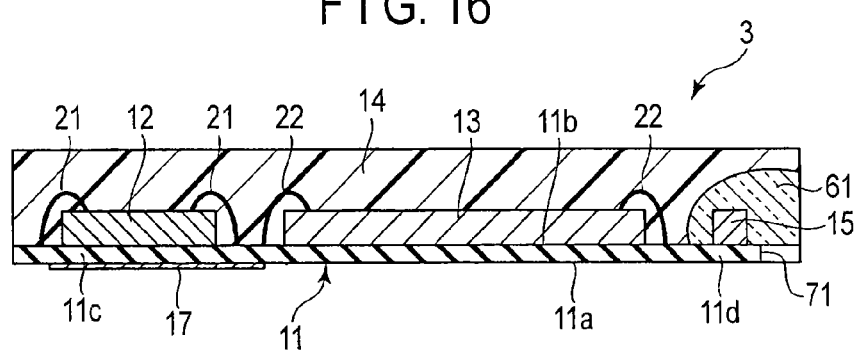
F I G. 17

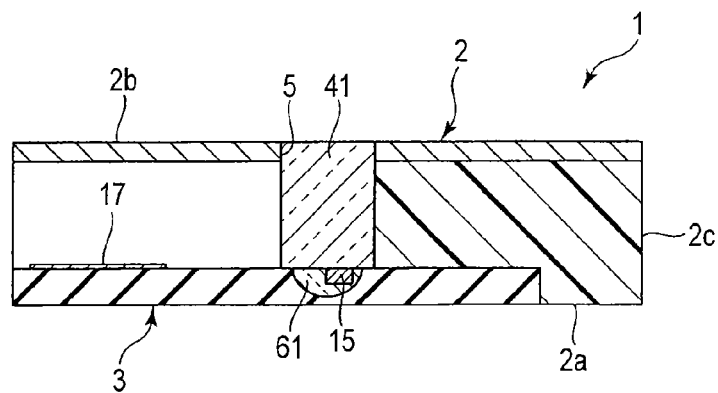
F I G. 20
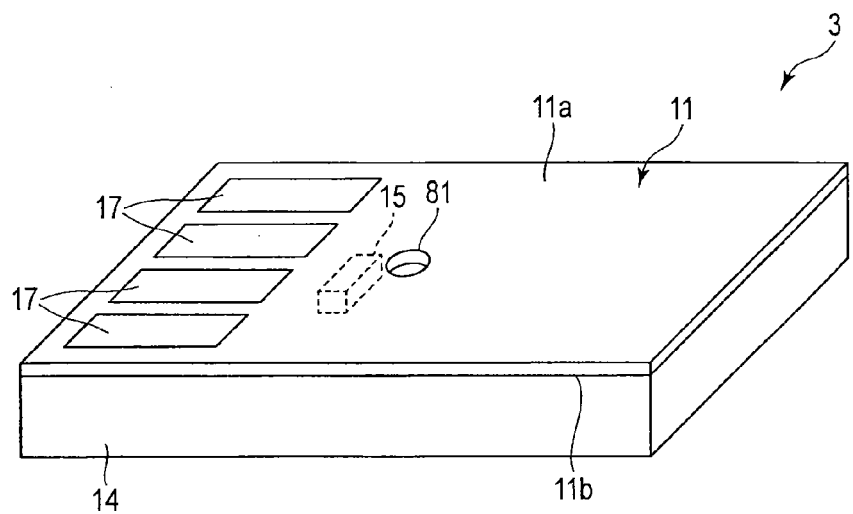
F I G. 21
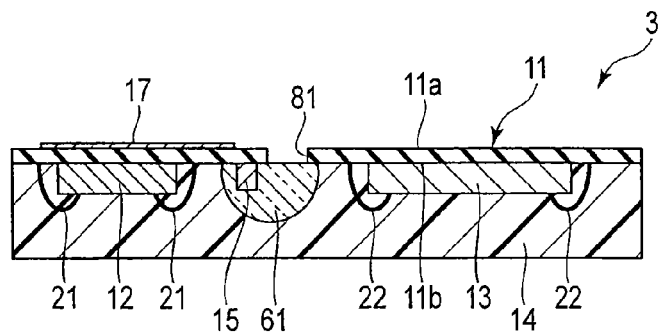
F I G. 22

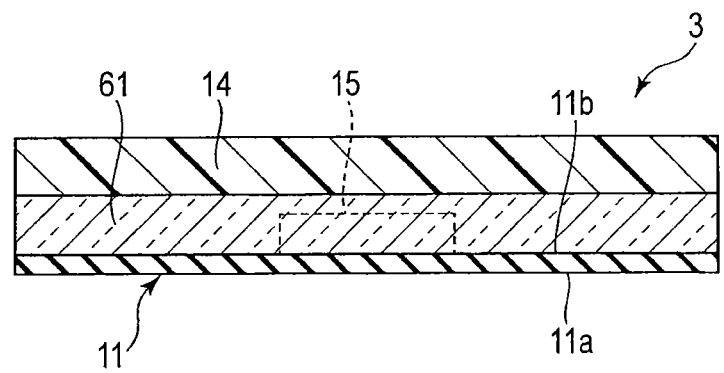
F I G. 23
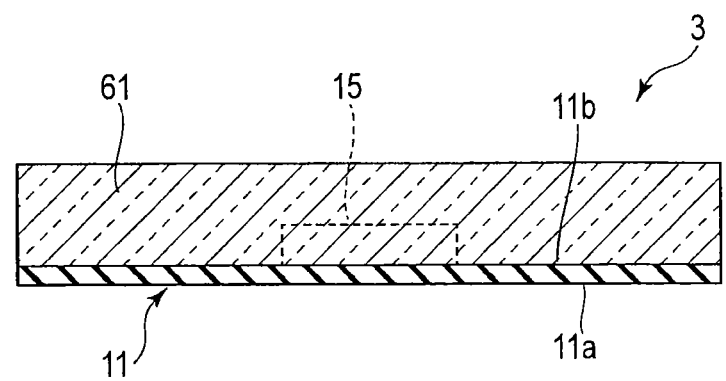
F I G. 24

SEMICONDUCTOR DEVICE, AND METHOD OF MANUFACTURING SEMICONDUCTOR DEVICE

CROSS-REFERENCE TO RELATED APPLICATIONS

This application claims the benefit of U.S. Provisional Application No. 61/863,650, filed Aug. 8, 2013, the entire contents of which are incorporated herein by reference.

FIELD

Embodiments described herein relate generally to semiconductor devices and methods of manufacturing semiconductor devices.

BACKGROUND

Semiconductor devices in which semiconductor chips are sealed with a molding resin are provided.

The improvement of convenience of semiconductor devices is desired.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

FIG. 3 is a perspective view schematically showing a module shown in FIG. 1;

FIG. 4 is a perspective view schematically showing the module shown in FIG. 1;

FIG. 5 is a perspective view schematically showing the module shown in FIG. 1;

FIG. 7 is a plan view schematically showing an example of the method of manufacturing the semiconductor device shown in FIG. 1;

FIG. 8 is a plan view schematically showing an example of the method of manufacturing the semiconductor device shown in FIG. 1;

FIG. 9 is a bottom view schematically showing a modification of a cover shown in FIG. 1;

FIG. 10 is a perspective view schematically showing a module of a semiconductor device according to a second embodiment;

FIG. 11 is a sectional view schematically showing the module shown in FIG. 10;

FIG. 15 is a plan view schematically showing an example of a method of manufacturing the semiconductor device shown in FIG. 13;

FIG. 16 is a diagram schematically showing a module of a semiconductor device according to a fourth embodiment;

FIG. 17 is a sectional view schematically showing the module shown in FIG. 16;

FIG. 20 is a sectional view schematically showing the semiconductor device shown in FIG. 19;

FIG. 21 is a perspective view schematically showing a module shown in FIG. 20;

FIG. 22 is a sectional view schematically showing the module shown in FIG. 20;

FIG. 23 is a sectional view schematically showing a module of a semiconductor device according to a sixth embodiment; and FIG. 24 is a sectional view schematically showing a module of a semiconductor device according to a seventh embodiment.

DETAILED DESCRIPTION

Figure 1:
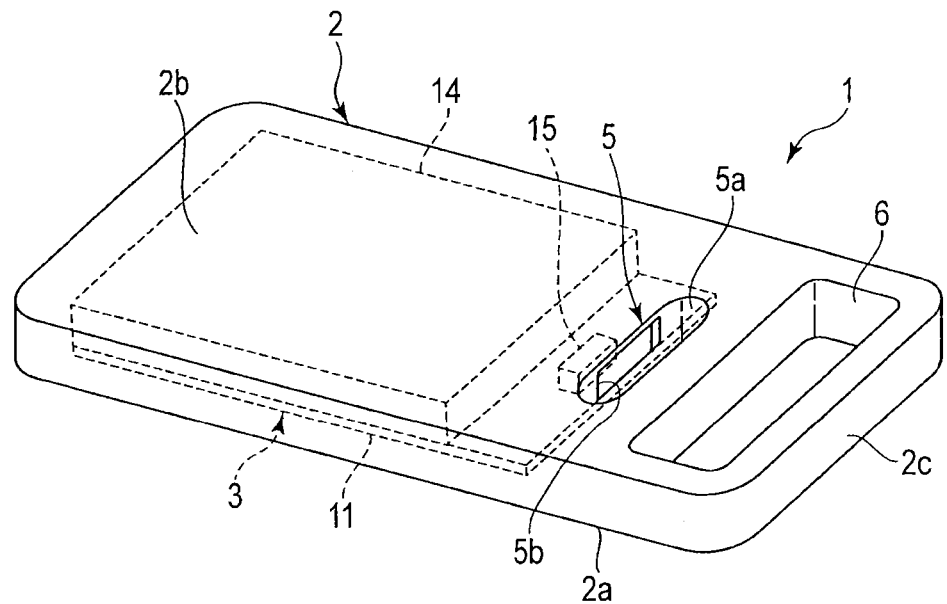
FIG. 1 is a perspective view schematically showing a semiconductor device according to a first embodiment.

Various embodiments will be described hereinafter with reference to the accompanying drawings.

In general, according to one embodiment, a semiconductor device comprises a board, a controller chip, a semiconductor chip, a sealing portion, and a component. The board comprises a first surface and a second surface opposite to the first surface, the first surface comprising a terminal. The controller chip is on the second surface of the board. The semiconductor chip is on the second surface of the board. The sealing portion integrally covers the controller chip and the semiconductor chip and does not cover a region of the second surface of the board. The component is on the region of the second surface of the board to perform an operation with respect to the outside of the semiconductor device.

In this specification, some components are expressed by two or more terms. Those terms are just examples. Those components may be further expressed by another or other terms. And the other components which are not expressed by two or more terms may be expressed by another or other terms.

The drawings are schematically illustrated. In the drawings, in some cases, the relationship between a thickness and planar dimensions or the scale of the thickness of each layer may be different from the actual relationship or scale. In addition, in the drawings, components may have different dimensions or scales. For convenience of description, a specific portion or region in some plan views is shown as hatching.

First Embodiment

FIGS. 1 to 9 show a semiconductor device 1 according to the first embodiment. The semiconductor device 1 is, for example, a semiconductor storage device and, for example, a NAND flash memory. An example of the semiconductor device 1 is a USB memory, but is not limited to such an example. The semiconductor device 1 may be, for example, an SD (trademark) memory card, microSD memory card or other semiconductor devices.

Figure 2:
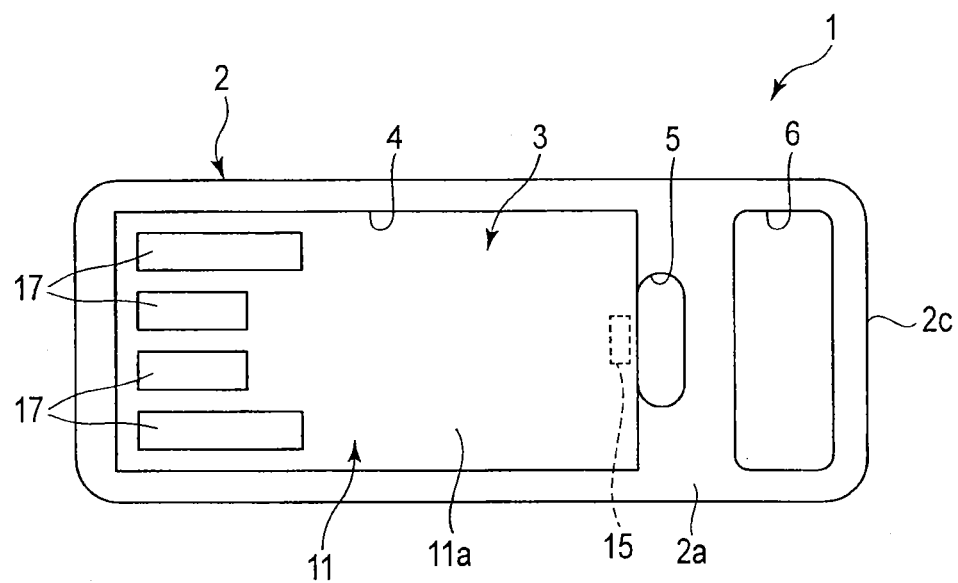
FIG. 2 is a bottom view schematically showing the semiconductor device shown in FIG. 1.

FIG. 1 is a perspective view showing the whole semiconductor device 1. FIG. 2 is a bottom view of the semiconductor device 1. As shown in FIGS. 1 and 2, the semiconductor device 1 includes, for example, a case 2 and a module 3 (e.g., a storage module) attached to the case 2.

The case 2 includes a first surface 2a, a second surface 2b, and a third surface 2c. The first surface 2a is, for example, the bottom surface and extends in the longitudinal direction of the semiconductor device 1. The second surface 2b is, for example, a top surface and is positioned on the opposite side of the first surface 2a. The second surface 2b extends substantially in parallel with the first surface 2a. The third surface 2c is, for example, a circumferential surface and extends in the thickness direction of the semiconductor device 1, which is a direction crossing (e.g., substantially perpendicular to) the first surface 2a and the second surface 2b. The third surface 2c connects an edge of the first surface 2a and an edge of the second surface 2b.

As shown in FIG. 2, an accommodation portion 4 (e.g., a recess) on which the module 3 is mounted is provided on the first surface 2a of the case 2. The accommodation portion 4 has a depth corresponding to, for example, the thickness of the module 3 and into which the whole module 3 is fitted. Accordingly, the first surface 2a of the case 2 constitutes a connected smooth plane in cooperation with a surface (e.g., the bottom surface) of the module 3. Excluding the accommodation portion 4, the first surface 2a of the case 2 is plane in its entire length and its entire width of the semiconductor device 1.

The case 2 is provided with an opening 5. The opening 5 is open to the accommodation portion 4 from at least one of the first surface 2a, the second surface 2b, and the third surface 2c of the case 2. The opening 5 according to the present embodiment includes a first hole 5a passing through from the first surface 2a to the second surface 2b and a second hole 5b open to the accommodation portion 4 from the inner circumferential surface of the first hole 5a.

However, the shape of the opening 5 is not limited to the above example. The opening is not limited to the through hole and may be, for example, a recess provided in one of the first surface 2a, the second surface 2b, and the third surface 2c. Various shapes are applicable to the opening 5 if a component (for example, an LED 15) mounted on the module 3 is configured to perform an operation with respect to the outside (e.g., its operation can be checked from the outside).

The case 2 is also provided with a finger placement portion 6. The finger placement portion 6 is a hole passing through, for example, from the first surface 2a to the second surface 2b of the case 2. Incidentally, the case 2 is not a required element and the module 3 alone may constitute an example of the "semiconductor device".

FIGS. 3 and 4 show perspective views of the module 3. FIG. 5 shows a sectional view of the module 3. As shown in FIGS. 3 to 5, the module 3 is a so-called SiP (System in Package) type semiconductor module. The module 3 includes a board 11, a controller chip 12, a semiconductor chip 13, a sealing portion 14, and the LED 15.

The board 11 (e.g., a wiring board) includes, for example, a base material made of glass epoxy resin and a wiring pattern provided on the base material. The board 11 includes a first surface 11a (e.g., a board terminal surface) and a second surface 11b (e.g., a mount surface) positioned on the opposite side of the first surface 11a. The first surface 11a and the second surface 11b are substantially parallel to each other and each extend in the extension direction of the board 11.

The first surface 11a of the board 11 is exposed to the outside of the module 3. Also, as shown in FIG. 2, the first surface 11a of the board 11 is exposed to the outside of the semiconductor device 1 (i.e., the outside of the case 2) in a state in which the board 11 is mounted on the case 2. As described above, the first surface 11a of the board 11 is positioned in substantially the same plane as the first surface 2a of the case 2 in the state in which the board 11 is mounted on the case 2.

As shown in FIGS. 3 to 5, for example, a plurality of terminals 17 is provided on the first surface 11a of the board 11. The terminal 17 is an external connection terminal electrically connected to an external device (e.g., the host) by being connected to a connector of the external device. The terminal 17 is a conductive layer (e.g., a metal layer) provided on the first surface 11a and extends two-dimensionally. The terminal 17 according to the present embodiment has the shape and arrangement conforming to the USB standard.

As shown in FIG. 5, the controller chip 12 (i.e., a control LSI) is mounted on the second surface 11b of the board 11. The controller chip 12 is an example of the "first semiconductor chip". The controller chip 12 controls the operation of the semiconductor chip 13. The controller chip 12 writes, reads, or erases data of the semiconductor chip 13 according to, for example, an external command to manage the storage state of data of the semiconductor chip 13.

An adhesive film (i.e., a bonding layer) is provided between the controller chip 12 and the second surface 11b of the board 11. The controller chip 12 is fixed to the second surface 11b of the board 11 by the adhesive film. The controller chip 12 is also electrically connected to the second surface 11b of the board 11 by bonding wires 21.

The semiconductor chip 13 is mounted on the second surface 11b of the board 11. The semiconductor chip 13 is an example of the "second semiconductor chip". The semiconductor chip 13 is, for example, any memory chip (i.e., a data storage LSI) and, for example, a NAND flash memory. However, the semiconductor chip 13 is not limited to the memory chip.

An adhesive film (i.e., a bonding layer) is provided between the semiconductor chip 13 and the second surface 11b of the board 11. The semiconductor chip 13 is fixed to the second surface 11b of the board 11 by the adhesive film. The semiconductor chip 13 is also electrically connected to the second surface 11b of the board 11 by bonding wires 22.

As shown in FIG. 4, a passive component 24 is also mounted on the second surface 11b of the board 11. The passive component is an example of each of the "component" and the "electronic component". The passive component 24 is, for example, a capacitor or a resistor, but is not limited to the capacitor and resistor. The passive component 24 is electrically connected to the board 11.

As shown in FIGS. 4 and 5, the sealing portion 14 (i.e., a resin portion, insulating sealing resin, mold, or mold resin portion) is provided on the second surface 11b of the board 11. The sealing portion 14 is formed from, for example, a black resin and does not allow light to pass through. An example of the sealing portion 14 is a resin (i.e., an epoxy resin). The sealing portion 14 integrally covers (i.e., integrally seals) the second surface 11b of the board 11, the controller chip 12, the semiconductor chip 13, the passive component 24, and the bonding wires 21, 22. The sealing portion 14 extends in the entire width of the board 11. The sealing portion 14 is formed, for example, in a rectangular parallelepiped shape and forms an outer shape (i.e., a package outer shape) of the module 3.

The LED 15 is mounted on the second surface 11b of the board 11 and is electrically connected to the board 11. More specifically, a pair of pads 25a, 25b are provided on the second surface 11b of the board 11. The LED 15 is connected on the pads 25a, 25b.

The LED 15 is an example of each of the "light source", the "electronic component", and the "component". The LED 15 is also electrically connected to the controller chip 12 via a wiring pattern of the board 11. The LED 15 receives a signal (i.e., a directive) about the operation from the controller chip 12 and performs an operation (e.g., light emission) that can be checked from the outside of the semiconductor device 1 based on the signal from the controller chip 12. When, for example, the semiconductor device 1 is connected to an external device (e.g., the host), the LED 15 emits light to let the user know that the external device is accessing the semiconductor device 1. The LED 15 is an example of the "component that performs an operation with respect to the outside of the semiconductor device".

The "component that performs an operation with respect to the outside of the semiconductor device" is not limited to the LED and may be, for example, a component (e.g., a buzzer) that produces a sound based on a signal from the controller chip 12 or a sensor (e.g., an optical sensor) that detects an external state and sends content thereof to the controller chip 12.

As shown in FIGS. 3 to 5, the board 11 includes a first end 11*c* and a second end 11*d* positioned on the opposite side of the first end 11*c*. The above terminals 17 are provided on the first end 11*c*. The LED 15 is provided on the second end 11*d*.

A first direction X and a second direction Y will be described here. The first direction X and the second direction Y are both along the second surface 11*b* of the board 11. The first direction X is a direction from the first end 11*c* to the second end 11*d* (or the opposite direction) and, for example, the direction of the length of the board 11. The second direction Y is a direction crossing (e.g., substantially perpendicular to) the first direction X and, for example, the width direction of the board 11. In the present embodiment, the LED 15 is provided in the center in the width direction (i.e., the second direction Y) of the second end 11*d*.

As shown in FIGS. 4 and 5, the sealing portion 14 does not cover a region of the second surface 11*b* of the board 11. In the present embodiment, the sealing portion 14 does not cover the second end 11*d* of the board 11. In the present embodiment, a region 27 (hereinafter, referred to as a non-sealed region 27) that is not covered by the sealing portion 14 of the board 11 extends in the entire width of the board 11 along the second direction Y. The non-sealed region 27 reaches the edge of the board 11.

The LED 15 is mounted on the non-sealed region 27 and exposed to the outside of the sealing portion 14. In other words, the sealing portion 14 is provided on the board 11 excluding a region (e.g., the second end 11*d*) where the LED 15 is provided so as to expose the LED 15 to the outside. In the non-sealed region 27, a wiring pattern of the board 11 may be provided inside the board 11.

As shown in FIGS. 1 and 2, the opening 5 of the case 2 is provided near the LED 15 and faces the LED 15. The opening 5 passes light emitted from the LED 15 to the outside of the case 2. Accordingly, light emission from the LED 15 can be checked from outside.

Next, an example of the method of manufacturing the semiconductor device 1 will be described.

Figure 6:
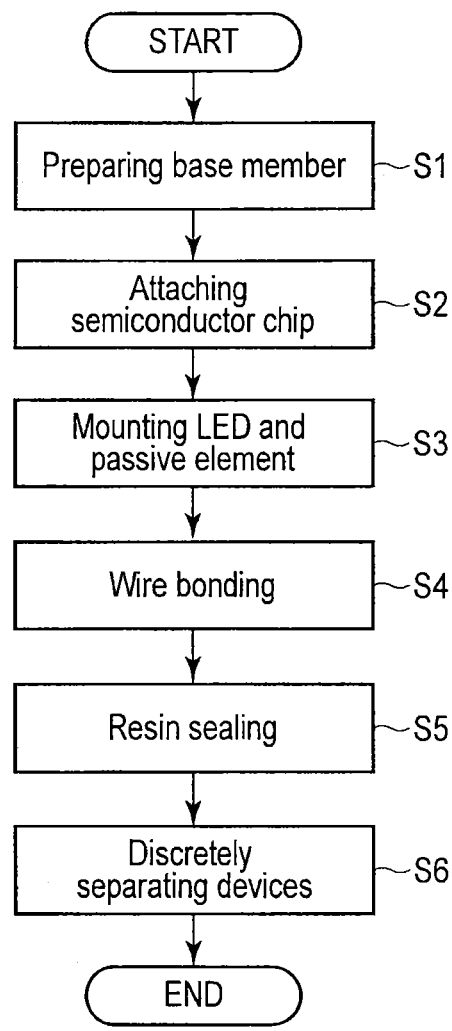
FIG. 6 is a flow chart showing an example of a method of manufacturing the semiconductor device shown in FIG. 1.

FIG. 6 is a flow chart showing an example of the method of manufacturing the semiconductor device 1. FIGS. 7 and 8 show states of manufacturing the semiconductor device 1. As shown in FIG. 6, a base member 31 from which a plurality of boards 11 can be cut out is provided (step S1). The base member 31 is a member that forms the boards 11 and is made of, for example, a glass epoxy resin. In the base member 31, wiring patterns are formed for each of the boards 11. The base member 31 includes, for example, a plurality of the boards 11 arranged in the first direction X and a plurality of the boards 11 arranged in the second direction Y.

Next, as shown in FIG. 7, a plurality of the controller chips 12 and a plurality of the semiconductor chips 13 are separated and arranged on the base member 31 on both sides of a boundary line L (i.e., a boundary line L extending in the second direction Y) as a center of the plurality of the boards 11 arranged in the first direction X (step S2). In the present embodiment, the plurality of the controller chips 12 and the plurality of the semiconductor chips 13 are arranged symmetrically (e.g., bilaterally symmetrically) with respect to the boundary line L extending in the second direction Y as the center. That is, the second ends 11*d* of the plurality of the boards 11 are mutually connected.

Next, as shown in FIG. 7, a plurality of the LEDs 15 is separated and arranged on both sides of the boundary line L in positions closer to the boundary line L than the plurality of the controller chips 12 and the plurality of the semiconductor chips 13 (step S3). That is, the plurality of the LEDs 15 is arranged together in a region between the plurality of the controller chips 12 and the plurality of the semiconductor chips 13.

Also, the passive components 24 are mounted on the board 11. In this case, solder is provided between the LED 15 and the board 11 and between the passive component 24 and the board 11. Then, a reflow process is performed to fix the LED 15 and the passive component 24 to the board 11.

Incidentally, the order of mounting of the controller chip 12 and the semiconductor chip 13 (step S2) and mounting of the LED 15 and the passive element 24 (step S3) may be reversed.

Next, the controller chip 12 and the semiconductor chip 13 are electrically connected to the board 11 by wire bonding (step S4).

Next, as shown in FIG. 8, the sealing portions 14 are provided such that the plurality of the controller chips 12 and the plurality of the semiconductor chips 13 are integrally covered and the plurality of the LEDs 15 is not covered (step S5). The sealing portions 14 are integrally provided for the plurality of the boards 11 contained in the base member 31. Accordingly, a region (e.g., an exposure region 32) where the plurality of the LEDs 15 is integrally exposed is provided between the sealing portions 14 of the plurality of the boards 11 arranged in the first direction X. That is, the non-sealed regions 27 of the two boards 11 are formed mutually continuously and integrally.

In the present embodiment, the non-sealed regions 27 are provided in the entire width of the boards 11 so that the non-sealed regions 27 of the plurality of the boards 11 arranged in the second direction Y are mutually connected. That is, the non-sealed regions 27 are continuous extending over the plurality of the boards 11 in the second direction Y.

Next, the base member 31 is cut along the boundary lines L extending in the first direction X and the second direction Y to divide the board 11 into individual pieces (step S6). Accordingly, the module 3 is provided. Then, the semiconductor device 1 is provided after the case 2 being mounted on the module 3.

According to the semiconductor device 1 configured as described above, a component (e.g., the LED 15) which performs an operation with respect to the outside can be mounted on the board 11 while the degree of freedom of the product shape being maintained or improved.

A case when the LED 15 is mounted on the first surface 11*a* of the board 11 will be considered here as a comparative example. In such a configuration, the LED 15 is made a protrusion compared with the terminal 17 of the board 11, which imposes restrictions on the shape of the case 2. That is, the first surface 2a of the case 2 needs a projecting portion to cover the LED. Thus, according to the semiconductor device in the comparative example, the degree of freedom of the product shape is limited.

Also according to the semiconductor device in the comparative example, a process to mount the LED 15 on the board 11 after sealing by mold resin is needed. Thus, in addition to a process to implement the passive component 24 inside Sip on the board 11, heat stress acts on the board 11 and various chips mounted on the board 11 also in the process to mount the LED 15 on the board 11 after sealing by mold resin. Thus, the reliability of the semiconductor device may be decreased, On the other hand, the semiconductor device 1 according to the present embodiment includes the board 11, the controller chip 12, the semiconductor chip 13, the sealing portion 14, and the LED 15. The board 11 includes the first surface 11a on which the terminal 17 is provided and the second surface 11b positioned on an opposite side of the first surface 11a. The controller chip 12 is on the second surface 11b of the board 11. The semiconductor chip 13 is on the second surface 11b of the board 11. The sealing portion 14 integrally covers the controller chip 12 and the semiconductor chip 13 and does not cover a region of the second surface 11b of the board 11. The LED 15 is located on the region that is not covered by the sealing portion 14 of the second surface 11b of the board 11 and performs an operation with respect to the outside of the semiconductor device 1.

According to the above configuration, in the semiconductor device 1 including the sealing portion 14 integrally covering the controller chip 12 and the semiconductor chip 13, the LED 15 can be mounted on the second surface 11b on the opposite side of the first surface 11a (i.e., the terminal surface) of the board 11. Thus, in the semiconductor device 1 including the LED 15, for example, the first surface 2a of the case 2 can be formed like a plane and the degree of freedom of the product shape can be maintained or improved.

Also according to the configuration of the present embodiment, the LED 15 can be mounted in one reflow process together with the passive component 24 inside the sealing portion 14. Thus, the heat stress acting on the semiconductor device 1 during mounting is small and the reliability of the semiconductor device 1 can be improved.

In the present embodiment, the non-sealed region 27 is provided on an end of the board 11. According to such a configuration, dead space can be reduced by providing the non-sealed region 27.

The method of manufacturing the semiconductor device 1 according to the present embodiment is to provide the base member 31 from which a plurality of the boards 11 can be cut out, to separate and arrange a plurality of the controller chips 12 and a plurality of the semiconductor chips 13 on both sides of the boundary line L of the plurality of the boards 11, to separate and arrange a plurality of the LEDs 15 on both sides of the boundary line L in positions closer to the boundary line L than the plurality of the controller chips 12 and the plurality of the semiconductor chips 13, to integrally cover the plurality of the controller chips 12 and the plurality of the semiconductor chips 13, to form the sealing portion 14 so as not to cover the plurality of the LEDs 15, and to cut the base member 31 along the boundary line L.

According to the above manufacturing method, the non-sealed regions 27 of the plurality of the boards 11 can integrally be formed and therefore, the manufacturing process and mold construction can be simplified.

In the present embodiment, the non-sealed region 27 extends in the entire width of the board 11. That is, when the semiconductor device 1 is manufactured, the non-sealed regions 27 are continuous extending over the plurality of the boards 11 in the second direction Y. Accordingly, the non-sealed regions 27 can also be integrally formed for the plurality of the boards 11 arranged in the second direction Y and therefore, the manufacturing process and mold construction can further be simplified.

FIG. 9 shows a modification of the case 2. As shown in FIG. 9, the opening 5 of the case 2 may also serve as the finger placement portion 6. In this modification, a light guide portion 41 that guides light of the LED 15 up to the opening 5 is provided between the opening 5 and the accommodation unit 4. The light guide portion 41 may simply be a through hole or a groove or a light guide formed from a material that allows light to pass through.

Second Embodiment

Next, a semiconductor device 1 according to the second embodiment will be described with reference to FIGS. 10 to 12. Incidentally, the same reference numerals are attached to the same elements as those in the first embodiment or elements having the same or similar functions and the description thereof is omitted. Other elements than elements described below are the same as those in the first embodiment.

FIG. 10 shows a perspective view of a module 3 according to the present embodiment. FIG. 11 shows a sectional view of the module 3. In the present embodiment, as shown in FIG. 10, a non-sealed portion 27 is provided only in a center portion in the width direction (i.e., a second direction Y) of a second end 11d of a board 11 corresponding to the position of an LED 15. A sealing portion 14 reaches the edge of the board 11 on both sides of the non-sealed portion 27.

Next, an example of the method of manufacturing the semiconductor device 1 according to the present embodiment will be described.

Figure 12:
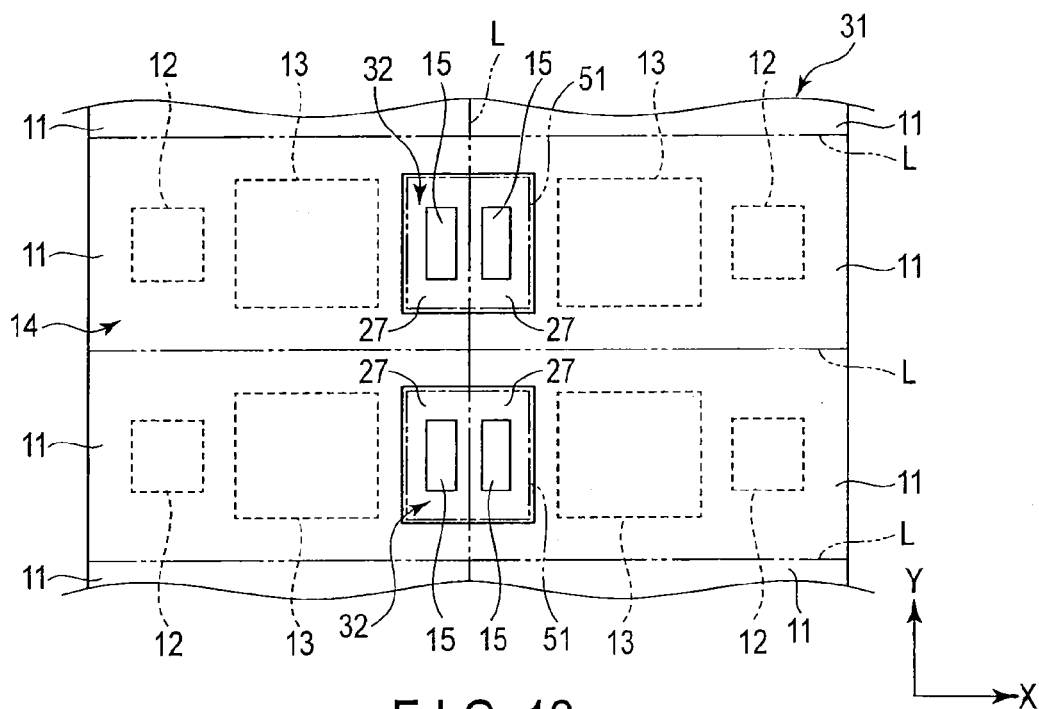
FIG. 12 is a plan view schematically showing an example of a method of manufacturing the semiconductor device shown in FIG. 10.

FIG. 12 shows a state of manufacturing the semiconductor device 1. In the present embodiment, a cover 51 (e.g., a protective cover or additional cover) in, for example, a box shape corresponding to the non-sealed regions 27 is mounted on, for example, a die to mold the sealing portion 14. The cover 51 extends over the non-sealed regions 27 of a plurality of the boards 11 arranged in the first direction X. That is, the non-sealed regions 27 of the two boards 11 are integrally formed by the one cover 51 being mounted.

According to the semiconductor device 1 configured as described above, like the first embodiment, a component (e.g., the LED 15) can be mounted on the board 11 while the degree of freedom of the product shape being maintained or improved. Also according to the semiconductor device 1 in the present embodiment, the semiconductor device 1 provided with the non-sealed region 27 can be manufactured without substantially changing the existing mold construction by mounting the cover 51. This contributes toward lowering costs of the semiconductor device 1.

Third Embodiment

Next, a semiconductor device 1 according to the third embodiment will be described with reference to FIGS. 13 to 15. Incidentally, the same reference numerals are attached to the same elements as those in the first embodiment or elements having the same of similar functions and the description thereof is omitted. Other elements than elements described below are the same as those in the first embodiment.

Figure 13:
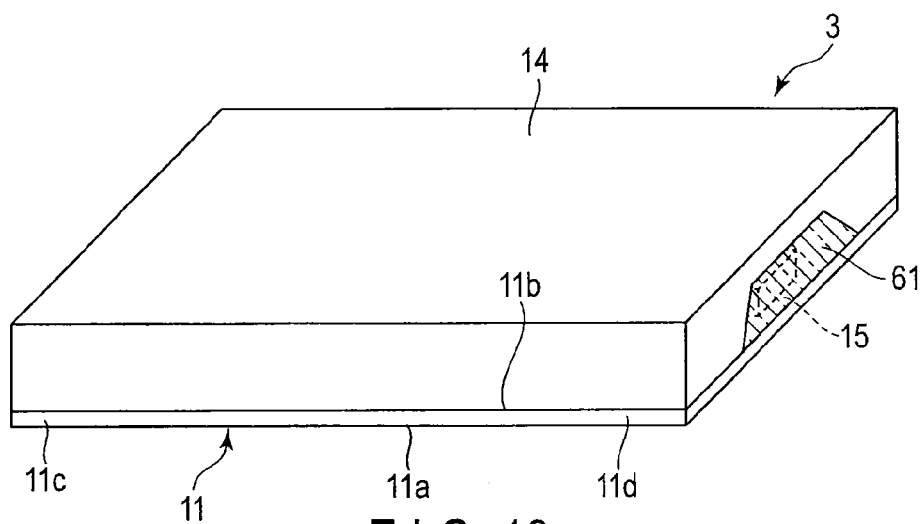
FIG. 13 is a perspective view schematically showing a module of a semiconductor device according to a third embodiment.
Figure 14:
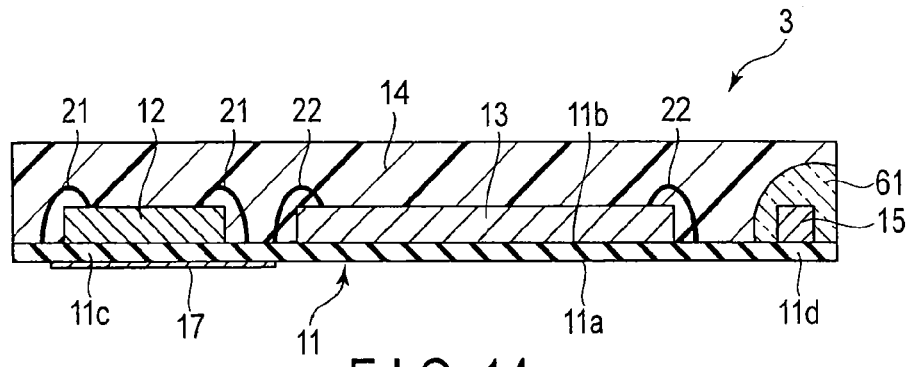
FIG. 14 is a sectional view schematically showing the module shown in FIG. 13.

FIG. 13 shows a perspective view of a module 3 according to the present embodiment. FIG. 14 shows a sectional view of the module 3. The semiconductor device 1 according to the present embodiment includes a light transmitting portion 61 covering an LED 15 by being provided on a second surface 11b of a board 11, instead of a non-sealed region 27 being provided. The LED 15 is positioned on a second end 11d of the board 11. The light transmitting portion 61 is positioned on the second end 11d of the board 11 and reaches the edge of the board 11. The light transmitting portion 61 is exposed from an end of the board 11 to the outside of a sealing portion 14 (i.e., outside the module 3).

The light transmitting portion 61 is, for example, a transparent material (e.g., a transparent resin), but is not limited to such an example. The light transmitting portion 61 only needs to allow at least a portion of light emitted from the LED 15 and may be, for example, a translucent or colored material. The light transmitting portion 61 guides light emitted from the LED 15 to the outside of the sealing portion 14. The light guided to the outside of the sealing portion 14 is given off to the outside of the semiconductor device 1 by passing through an opening 5 of a case 2 shown in FIG. 1 or a light guide portion 41 shown in FIG. 9.

Also in the present embodiment, the "component that performs an operation with respect to the outside of the semiconductor device" is not limited to the LED and may be, for example, an optical sensor that detects an external state and sends content thereof to a controller chip 12. In this case, the light transmitting portion 61 only needs to be a material allowing at least a portion of light from outside to reach the sensor.

The sealing portion 14 according to the present embodiment integrally covers (i.e., integrally seals) a second surface 11b of the board 11, at least a portion of the light transmitting portion 61, the controller chip 12, a semiconductor chip 13, a passive component 24, and bonding wires 21, 22. The sealing portion 14 extends in the entire length and the entire width of the board 11. The sealing portion 14 is formed, for example, in a rectangular parallelepiped shape and forms an outer shape (i.e., a package outer shape) of the module 3.

The sealing portion 14 according to the present embodiment covers the light transmitting portion 61 from the opposite side of the board 11. In addition, the sealing portion 14 is positioned on both sides of the light transmitting portion 61. Accordingly, the sealing portion 14 surrounds the light transmitting portion 61 from three directions including the upper direction of the light transmitting portion 61. On the other hand, the sealing portion 14 exposes a portion of the light transmitting portion 61 to the outside of the sealing portion 14 in the first direction X.

FIG. 15 shows a state of manufacturing the semiconductor device 1. The light transmitting portion 61 is formed by, for example, heaping a light transmission resin 62 on a base member 31 by potting. The resin 62 extends over the light transmitting portions 61 of a plurality of the boards 11 arranged in the first direction X. That is, the light transmitting portions 61 of the two boards 11 are formed from the resin 62 heaped in one place.

After the resin 62 is heaped, the base member 31 has the sealing portion 14 provided on the resin 62. Then, the board 11 is divided into individual pieces by cutting the base member 31 and the resin 62 along boundary lines L extending in the first direction X and the second direction Y. Accordingly, the module 3 according to the present embodiment is provided. Incidentally, other manufacturing processes are the same as those in the first embodiment.

According to the semiconductor device 1 configured as described above, like the first embodiment, a component (e.g., the LED 15) can be mounted on the board 11 while the degree of freedom of the product shape being maintained. Also according to the semiconductor device 1 in the present embodiment, the semiconductor device 1 on which the LED 15 can be mounted can be manufactured without changing the existing mold construction. This contributes toward lowering costs of the semiconductor device 1.

Further, the sealing portion 14 can be provided on the entire surface of the board 11 if, like in the present embodiment, the light transmitting portion 61 is provided. This contributes toward improving strength of the semiconductor device 1.

By providing the resin 62 to extend over the plurality of the boards 11 and cutting the resin 62 along the boundary line L like in the manufacturing method according to the present embodiment, the forming process of the light transmitting portion 61 can be simplified and also at least a portion of the light transmitting portion 61 can reliably be exposed to the outside of the sealing portion 14.

Fourth Embodiment

Next, a semiconductor device 1 according to the fourth embodiment will be described with reference to FIGS. 16 to 18. Incidentally, the same reference numerals are attached to the same elements as those in the first and third embodiments or elements having the same or similar functions and the description thereof is omitted. Other elements than elements described below are the same as those in the third embodiment.

FIG. 16 is a bird's-eye view showing a module 3 in the present embodiment. FIG. 17 shows a sectional view of the module 3. A board 11 according to the present embodiment is provided with a cut-out 71 passing through from a first surface 11a to a second surface 11b. The cut-out 71 is provided on a second end 11d of the board 11 and abuts on a light transmitting portion 61. The cut-out 71 exposes the light transmitting portion 61 to the side of the first surface 11a of the board 11.

Thus, a portion of light guided from an LED 15 to the light transmitting portion 61 passes through the cut-out 71 and emits from the first surface 11a of the board 11. As shown in FIG. 2, a case 2 does not cover, for example, the first surface 11a of the board 11. Thus, light emitted from the first surface 11a of the board 11 can be checked from outside the case 2 (i.e., outside the semiconductor device 1).

Figure 18:
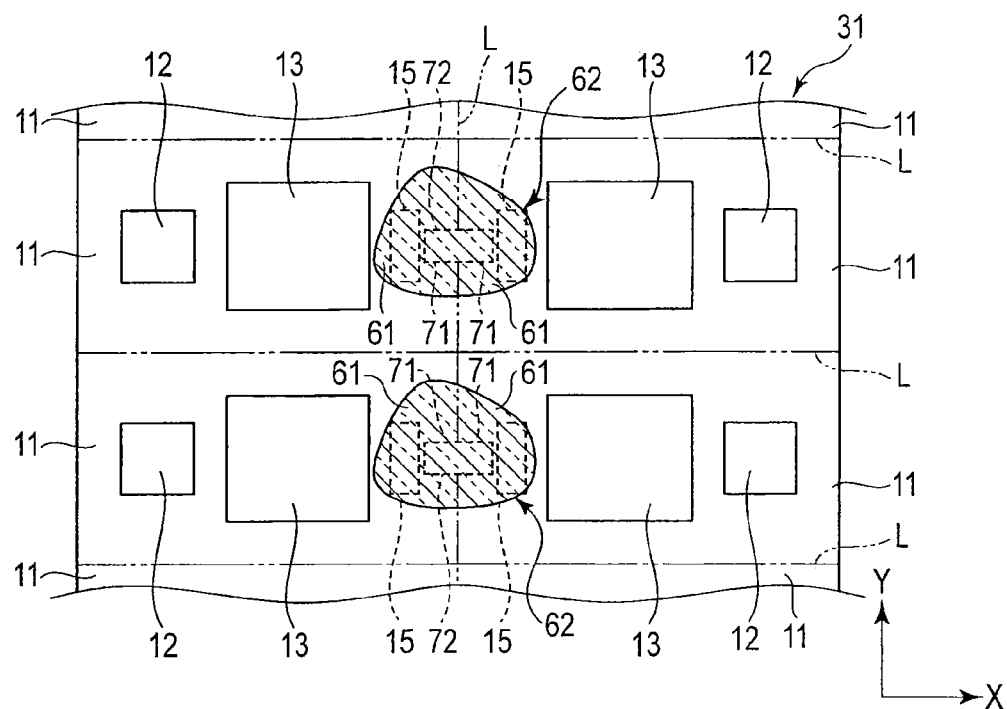
FIG. 18 is a plan view schematically showing an example of a method of manufacturing the semiconductor device shown in FIG. 16.

FIG. 18 shows a state of manufacturing the semiconductor device 1. The cut-out 71 is provided by a through hole 72 passing through a plurality of the boards 11 being provided and a base member 31 being cut along a boundary line L. That is, the cut-outs 71 of the two boards 11 are integrally formed by the through hole 72 provided in one place. The through hole 72 is provided before, for example, a resin 62 is provided.

According to the semiconductor device 1 configured as described above, like the first embodiment, a component (e.g., the LED 15) can be mounted on the board 11 while the degree of freedom of the product shape being maintained. Also according to the semiconductor device 1 in the present embodiment, like the third embodiment, the semiconductor device 1 on which the LED 15 can be mounted can be manufactured without changing the existing mold construction so that lower costs of the semiconductor device 1 can be achieved.

In the present embodiment, the board 11 is provided with the cut-out 71 passing through from the first surface 11a to the second surface 11b to expose the light transmitting portion 61 to the side of the first surface 11a. Accordingly, the semiconductor device 1 in which light emission of the LED 15 can be checked also from the side of the first surface 11a of the board 11 can be provided.

Fifth Embodiment

Next, a semiconductor device 1 according to the fifth embodiment will be described with reference to FIGS. 19 to 22. Incidentally, the same reference numerals are attached to the same elements as those in the first and third embodiments or elements having the same or similar functions and the description thereof is omitted. Other elements than elements described below are the same as those in the third embodiment.

Figure 19:
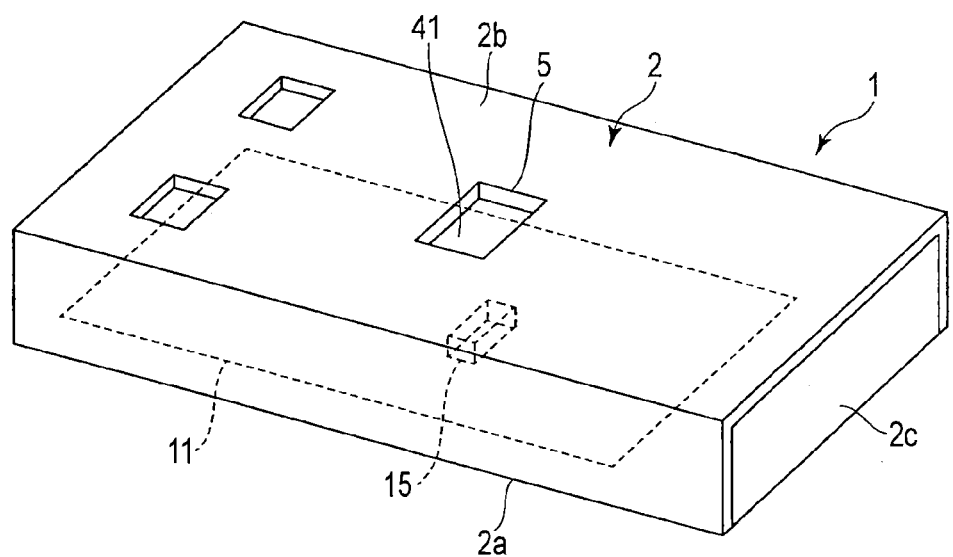
FIG. 19 is a perspective view schematically showing a semiconductor device according to a fifth embodiment.

FIG. 19 is a perspective view showing the semiconductor device 1 in the present embodiment. FIG. 20 is a sectional view of the semiconductor device 1. A case 2 according to the present embodiment includes an opening 5 and a light guide portion 41 provided in the opening 5. As shown in FIG. 20, the light guide portion 41 extends, for example, from the opening 5 to a module 3 and faces, for example, a light transmitting portion 61 of the module 3.

FIG. 21 is a perspective view of the module 3 according to the present embodiment. FIG. 22 is a sectional view of the module 3. An LED 15 according to the present embodiment is mounted in any position (e.g., the center portion) of a board 11. The board 11 according to the present embodiment is provided with a hole 81 passing through from a first surface 11a to a second surface 11b. The hole 81 abuts on the light transmitting portion 61. The hole 81 exposes the light transmitting portion 61 to the side of the first surface 11a of the board 11.

Thus, a portion of light guided from an LED 15 to the light transmitting portion 61 passes through the hole 81 and emits from the first surface 11a of the board 11. Light emitted from the first surface 11a of the board 11 can be checked from outside the case 2 (i.e., outside the semiconductor device 1) when the light passes through the light guide portion 41 of the case 2.

According to the semiconductor device 1 configured as described above, like the first embodiment, a component (e.g., the LED 15) can be mounted on the board 11 while the degree of freedom of the product shape being maintained. Also according to the semiconductor device 1 in the present embodiment, like the third embodiment, the semiconductor device 1 on which the LED 15 can be mounted can be manufactured without changing the existing mold construction so that lower costs of the semiconductor device 1 can be achieved. Also according to the present embodiment, the LED 15 can be mounted in any position of the board 11.

Sixth Embodiment

Next, a semiconductor device 1 according to the sixth embodiment will be described with reference to FIG. 23. Incidentally, the same reference numerals are attached to the same elements as those in the first and third embodiments or elements having the same or similar functions and the description thereof is omitted. Other elements than elements described below are the same as those in the third embodiment.

FIG. 23 is a sectional view of a module 3 according to the present embodiment. In the present embodiment, a light transmitting portion 61 is provided extending over the entire surface of a board 11. That is, the light transmitting portion 61 is provided extending over the entire length and the entire width of the board 11. A sealing portion 14 is provided so as to cover the light transmitting portion 61 from the opposite side of the board 11. That is, a two-layer structure of the light transmitting portion 61 and the sealing portion 14 is provided on a second surface 11b of the board 11. The light transmitting portion 61 is exposed to the outside of the module 3 in the entire circumferential surface of the module 3.

According to the semiconductor device 1 configured as described above, like the first embodiment, a component (e.g., an LED 15) can be mounted on the board 11 while the degree of freedom of the product shape being maintained. Also according to the present embodiment, the semiconductor device 1 in which light emission of the LED 15 can be checked from the entire circumference of the semiconductor device 1 can be provided. In addition, a plurality of the LEDs 15 can be arranged along the outer circumference of the board 11. Further, the light transmitting portion 61 according to the present embodiment can be provided by using a die without potting. This can improve the degree of freedom of the method of manufacturing the semiconductor device 1.

Seventh Embodiment

Next, a semiconductor device 1 according to the seventh embodiment will be described with reference to FIG. 24. Incidentally, the same reference numerals are attached to the same elements as those in the first and third embodiments or elements having the same or similar functions and the description thereof is omitted. Other elements than elements described below are the same as those in the third embodiment.

FIG. 24 is a sectional view of a module 3 according to the present embodiment. In the present embodiment, a light transmitting portion 61 is provided extending over the entire surface of a board 11. In the present embodiment, the light transmitting portion 61 integrally covers a controller chip 12, a semiconductor chip 13, a passive element 24 and the like and also forms an outer shape (i.e., a package outer shape) of the module 3. That is, the light transmitting portion 61 in the present embodiment also assumes the role of a sealing portion 14.

According to the semiconductor device 1 configured as described above, like the first embodiment, a component (e.g., an LED 15) can be mounted on the board 11 while the degree of freedom of the product shape being maintained. Also according to the present embodiment, the semiconductor device 1 in which light emission of the LED 15 can be checked from the entire circumference of the semiconductor device 1 and from above can be provided. In addition, the LED 15 can be arranged in any position and also a plurality of the LEDs 15 can be provided. Further, the light transmitting portion 61 according to the present embodiment can be provided by using a die without potting. This can improve the degree of freedom of the method of manufacturing the semiconductor device 1.

In the foregoing, the first to seventh embodiments have been described, but the present invention is not limited to the above embodiments. Elements in each embodiment can appropriately be modified, exchanged, or combined to carry out each embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
    a board comprising a first surface and a second surface opposite to the first surface, the first surface comprising a terminal;
    a controller chip on the second surface of the board;
    a semiconductor chip on the second surface of the board;
    a sealing portion integrally covering the controller chip and the semiconductor chip, wherein the sealing portion does not cover a region of the second surface of the board; and
    a component on the region of the second surface of the board to perform an operation with respect to the outside of the semiconductor device.

2. The device of claim 1, wherein
    the component is a light source whose light emission is to be checked from the outside of the semiconductor device.

3. The device of claim 1, wherein
    the region of the board is in an end of the board.

4. The device of claim 3, wherein
    the region of the board extends over an entire width of the board.

5. A semiconductor device comprising:
    a board comprising a first surface and a second surface opposite to the first surface, the first surface comprising a terminal;
    a controller chip on the second surface of the board;
    a semiconductor chip on the second surface of the board;
    a component on the second surface of the board;
    a light transmitting portion on the second surface of the board, the light transmitting portion covering the component; and
    a sealing portion integrally covering the controller chip, the semiconductor chip, and the light transmitting portion, the sealing portion exposing a part of the light transmitting portion to the outside of the sealing portion.

6. The device of claim 5, wherein
    the component is a light source whose light emission through the light transmitting portion is to be checked from the outside of the semiconductor device.

7. The device of claim 5, wherein
    the component is in an end of the board, and
    the light transmitting portion is exposed from the end of the board to the outside of the sealing portion.

8. The device of claim 7, wherein
    the board comprises a cut-out passing through from the first surface to the second surface to expose the light transmitting portion to a side of the first surface.

9. The device of claim 5, wherein
    the board comprises a hole passing through from the first surface to the second surface to expose the light transmitting portion to a side of the first surface.

10. A method of manufacturing a semiconductor device comprising:
    preparing a base member comprising boards;
    arranging controller chips and semiconductor chips separately on both sides of a boundary line of the boards;
    arranging components separately on the both sides of the boundary line in positions closer to the boundary line than the controller chips and the semiconductor chips;
    forming a sealing portion so as to integrally cover the controller chips and the semiconductor chips and not to cover the components; and
    cutting the base member along the boundary line.

11. The method of claim 10 wherein
    each of the components is configured to perform an operation with respect to the outside of the semiconductor device.

12. The method of claim 10 wherein
    each of the components is a light source whose light emission is to be checked from the outside of the semiconductor device.

13. The method of claim 10 wherein
    the boards are arranged in the base member in a first direction and a second direction perpendicular to the first direction,
    the boundary line extends in the second direction, and
    a region not covered by the sealing portion continues extending over the plurality of boards in the second direction.

* * * * *